(12) United States Patent
Morgan et al.

(10) Patent No.: US 10,465,533 B2
(45) Date of Patent: Nov. 5, 2019

(54) CERAMIC MATRIX COMPOSITE COMPONENT AND PROCESS OF PRODUCING A CERAMIC MATRIX COMPOSITE COMPONENT

(71) Applicant: GENERAL ELECTRIC COMPANY, Schenectady, NY (US)

(72) Inventors: Victor John Morgan, Simpsonville, SC (US); Jacob John Kittleson, Greenville, SC (US); Andres Jose Garcia-Crespo, Greenville, SC (US); Benjamin Paul Lacy, Greer, SC (US)

(73) Assignee: General Electric Company, Schenectady, NY (US)

(*) Notice: Subject to any disclaimer, the term of this patent is extended or adjusted under 35 U.S.C. 154(b) by 932 days.

(21) Appl. No.: 14/878,084

(22) Filed: Oct. 8, 2015

(65) Prior Publication Data

US 2017/0101873 A1    Apr. 13, 2017

(51) Int. Cl.
*F01D 5/28* (2006.01)
*C23C 16/44* (2006.01)
(Continued)

(52) U.S. Cl.
CPC .............. *F01D 5/282* (2013.01); *B32B 18/00* (2013.01); *C04B 35/573* (2013.01); *C04B 35/6269* (2013.01); *C04B 35/806* (2013.01); *C23C 16/44* (2013.01); *F01D 9/02* (2013.01); *F01D 25/005* (2013.01); *C04B 2235/5244* (2013.01); *C04B 2235/5248* (2013.01);
(Continued)

(58) Field of Classification Search
CPC .................... F01D 1/02; F03B 11/00

USPC ................................. 415/115, 200
See application file for complete search history.

(56) References Cited

U.S. PATENT DOCUMENTS 6,641,907 B1   11/2003   Merrill et al.
6,746,755 B2    6/2004   Morrison et al.
(Continued)

FOREIGN PATENT DOCUMENTS

EP         2 828 052 A2      1/2015
WO     2015/041823 A1        3/2015

OTHER PUBLICATIONS

Extended European Search Report and Opinion issued in connection with corresponding EP Application No. 16192480.8 dated Feb. 24, 2017.

*Primary Examiner* — Dah-Wei D. Yuan
*Assistant Examiner* — Andrew J Bowman
(74) *Attorney, Agent, or Firm* — McNees Wallace & Nurick LLC (57) ABSTRACT

A process of producing a hot gas path turbine component. The process includes forming a void in a first ceramic matrix composite ply and forming a void in a second ceramic matrix composite ply. The second ceramic matrix composite ply is positioned on the first ceramic matrix composite ply such that the positioning aligns the voids to at least partially define a cavity in the component. A third ceramic matrix composite ply is positioned on the first ceramic matrix composite ply and the first ceramic matrix composite ply, the second ceramic matrix composite ply and the third ceramic matrix composite ply are densified to form a densified body. The cavity is present in the densified body. A ceramic matrix composite having cavities therein is also disclosed.

19 Claims, 7 Drawing Sheets

(51) Int. Cl.
- *F01D 9/02* (2006.01)
- *F01D 25/00* (2006.01)
- *B32B 18/00* (2006.01)
- *C04B 35/573* (2006.01)
- *C04B 35/626* (2006.01)
- *C04B 35/80* (2006.01)

(52) U.S. Cl.
CPC ......... *C04B 2235/5268* (2013.01); *C04B 2235/612* (2013.01); *C04B 2235/614* (2013.01); *C04B 2235/616* (2013.01); *C04B 2237/365* (2013.01); *C04B 2237/38* (2013.01); *C04B 2237/62* (2013.01); *F05D 2220/32* (2013.01); *F05D 2230/314* (2013.01); *F05D 2240/128* (2013.01); *F05D 2240/35* (2013.01); *F05D 2300/6033* (2013.01)

(56) References Cited

U.S. PATENT DOCUMENTS

| | | |
|---|---|---|
| 7,153,096 B2 | 12/2006 | Thompson et al. |
| 2005/0022921 A1 | 2/2005 | Morrison et al. |
| 2005/0158171 A1* | 7/2005 | Carper .................. B32B 18/00 415/200 |
| 2007/0140835 A1* | 6/2007 | Albrecht ................ F01D 5/147 415/115 |
| 2015/0022921 A1 | 1/2015 | Vinson |

\* cited by examiner

FIG. 7

US 10,465,533 B2

CERAMIC MATRIX COMPOSITE COMPONENT AND PROCESS OF PRODUCING A CERAMIC MATRIX COMPOSITE COMPONENT

FIELD OF THE INVENTION

The present invention relates generally to gas turbines for power generation and more specifically to methods of forming ceramic matrix composite components for hot gas path turbine components for gas turbines.

BACKGROUND OF THE INVENTION

As with turbine blades and vanes formed from more conventional superalloy materials, CMC blades and vanes are primarily equipped with cavities and cooling voids to reduce weight, reduce centrifugal load, and reduce operating temperatures of the components. These features are typically formed in CMC components using a combination of removable and expendable tooling. Internal cooling channels are advantageous for cooling both metal and CMC hot-gas path hardware as they reduce cooling flow requirements and thermal gradients/stress.

Silicon carbide (SiC)-based ceramic matrix composite (CMC) materials have been proposed as materials for certain components of gas turbine engines, such as the turbine blades, vanes, nozzles, and buckets. Various methods are known for fabricating SiC-based components, including Silicomp, melt infiltration (MI), chemical vapor infiltration (CVI), polymer inflation pyrolysis (PIP), and oxide/oxide processes. Though these fabrication techniques significantly differ from each other, each involves the use of hand lay-up and tooling or dies to produce a near-net-shape part through a process that includes the application of heat at various processing stages.

Current fabrication methods for forming internal passages or cavities in CMC components use materials that need to be "melted" out or removed from the internal passage during the burn-out cycle. Forming CMC components with a cavity includes a number of steps, including using pre-forms. First, a plurality of ceramic plies, some of which can include reinforcing material or are pre-impregnated with matrix, are laid up on a mandrel or mold in a pre-determined pattern to provide desired final or near-net-shape and desired mechanical properties of component. The mandrel is generally selected from materials such as tin, vinyl, or other meltable materials. The laid-up plies may be pre-impregnated (prepreg) with matrix material, such as SiC or impregnated with matrix after lay-up of the plies. Prior to densification of the CMC pre-form, the mandrel is removed through a burn-out cycle. In the burn-out cycle, the CMC pre-form is inverted and the mandrel forming materials, such as tin, vinyl, or other meltable materials, are melted out through the open tip of the pre-form CMC leaving an open tip area.

BRIEF DESCRIPTION OF THE INVENTION

In an embodiment, a process of producing a hot gas path turbine component. The process includes forming a void in a first ceramic matrix composite ply and forming a void in a second ceramic matrix composite ply. The second ceramic matrix composite ply is positioned on the first ceramic matrix composite ply such that the positioning aligns the voids to at least partially define a cavity in the component. A third ceramic matrix composite ply is positioned on the first ceramic matrix composite ply and the first ceramic matrix composite ply, the second ceramic matrix composite ply and the third ceramic matrix composite ply are densified to form a densified body. The cavity is present in the densified body.

In another embodiment, a ceramic matrix composite component. The process includes positioning a first ceramic matrix composite ply in contact with a second ceramic matrix composite ply. The first ceramic matrix composite ply and the second ceramic matrix composite ply are partially rigidized to form a rigidized preform. A void is formed in the rigidized preform. A third ceramic matrix composite ply is positioned on the first ceramic matrix composite ply. The first ceramic matrix composite ply, the second ceramic matrix composite ply and the third ceramic matrix composite ply are subjected to rigidizing. The first ceramic matrix composite ply, the second ceramic matrix composite ply and the third ceramic matrix composite ply are densified to form a densified body. The cavity is present in the densified body.

In another embodiment, a ceramic matrix composite component. The ceramic matrix composite includes a plurality of ceramic matrix composite plies forming a densified body. The plurality of ceramic matrix plies each have voids that align to define a cavity within the densified body. The cavity has a rectilinear boundary along at least a portion of the densified body.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Embodiments of the present disclosure, for example, in comparison to concepts failing to include one or more of the features disclosed herein, enable near-wall cooling which reduces the thru-wall thermal gradient as well as more efficiently cooling the hot-gas-path hardware, and more efficient cooling that has the ability to reduce the cooling demand and flow-rate of the part. Embodiments of the present disclosure also permit lower cooling flow, for high turbine performance. In addition, the components of the present disclosure have a lower thermal gradient, resulting in lower stress, longer life and lower life cycle costs, as well as a greater flexibility in design. The method, according to the present disclosure, has decreased complexity with low cost and does not require expensive and time consuming leaching of cooling channels. Further, the method, according to the present disclosure, does not have the risk of residual sacrificial material remaining in cooling channels after processing.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Systems used to generate power include, but are not limited to, gas turbines, steam turbines, and other turbine assemblies, such as land based aero-derivatives, used for power generation. In certain applications, the power generation systems, including the turbomachinery therein (e.g., turbines, compressors, and pumps), and other machinery may include components that are exposed to heavy wear conditions. For example, certain power generation system components, such as blades, buckets, casings, rotor wheels, shafts, shrouds, nozzles, and so forth, may operate in high heat and high revolution environments. These components are manufactured using ceramic matrix composites and these components may also include cooling passages. The present disclosure provides a method to form ceramic matrix composite (CMC) components including cooling passages. An exemplary embodiment of the disclosure is shown in FIGS. 1-3 as a turbine blade, but the present disclosure is not limited to the illustrated structure.

Figure 1:
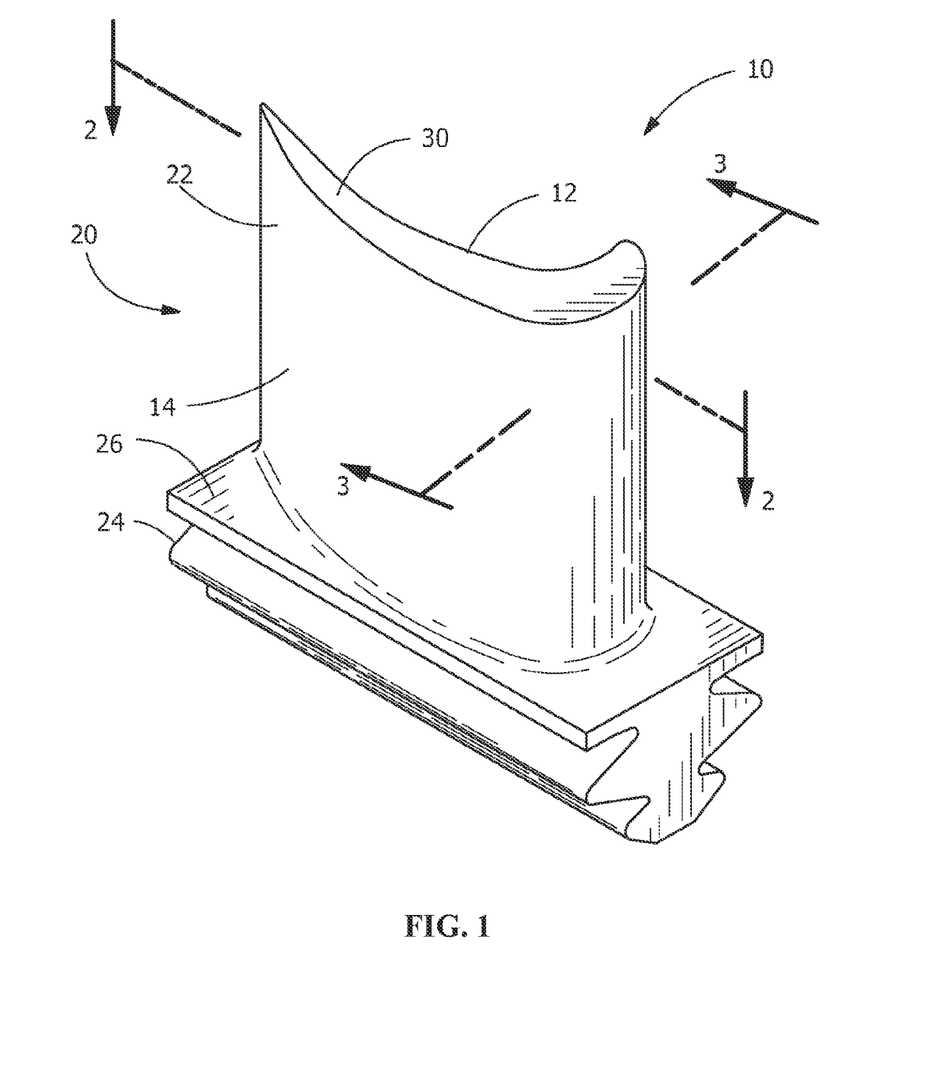
FIG. 1 is a perspective view of a ceramic matrix composite (CMC) component of the present disclosure.

FIG. 1 is a perspective view of a component 10, such as but not limited to, a turbine blade or turbine vane. Although FIG. 1 shows a turbine blade, other suitable components, according to the present disclosure, include, but are not limited to, a liner, a blade, a shroud, a nozzle, a combustor, a nozzle end wall, a blade platform or other hot gas path component. Component 10 is preferably formed of a ceramic matrix composite (CMC) material. Material for component 10 includes, but is not limited to, oxide based CMCs such as, but not limited to, alumina, mullite, boron nitride, boron carbide, sialons (silicon, aluminum, oxygen, and nitrogen), intermetallics, and combinations thereof. A suitable example of material for component 10 includes, but is not limited to, AN-720 (oxide-oxide based), which is available from COI Ceramics, Inc., San Diego, Calif., or a hybrid oxide CMC material. Suitable examples of materials used to make components 10, include, but are not limited to, SiC fibers impregnated with a SiC and carbon matrix with various binders. Component 10 includes an airfoil 22 against which the flow of hot exhaust gas is directed. The airfoil 22 extends from tip 30 to dovetail 24. Component 10 is mounted to a turbine disk (not shown) by the dovetail 24 which extends downwardly from airfoil 22 and engages a slot on the turbine disk. A platform 26 extends laterally outwardly from the area where airfoil 22 is joined to dovetail 24. Turbine blade 20 includes at least one plenum 50 as shown in FIG. 2, extending along the interior of airfoil 22. During operation of a power generation system, a flow of cooling air is directed through plenum 50 to reduce the temperature of airfoil 22.

Figure 2:
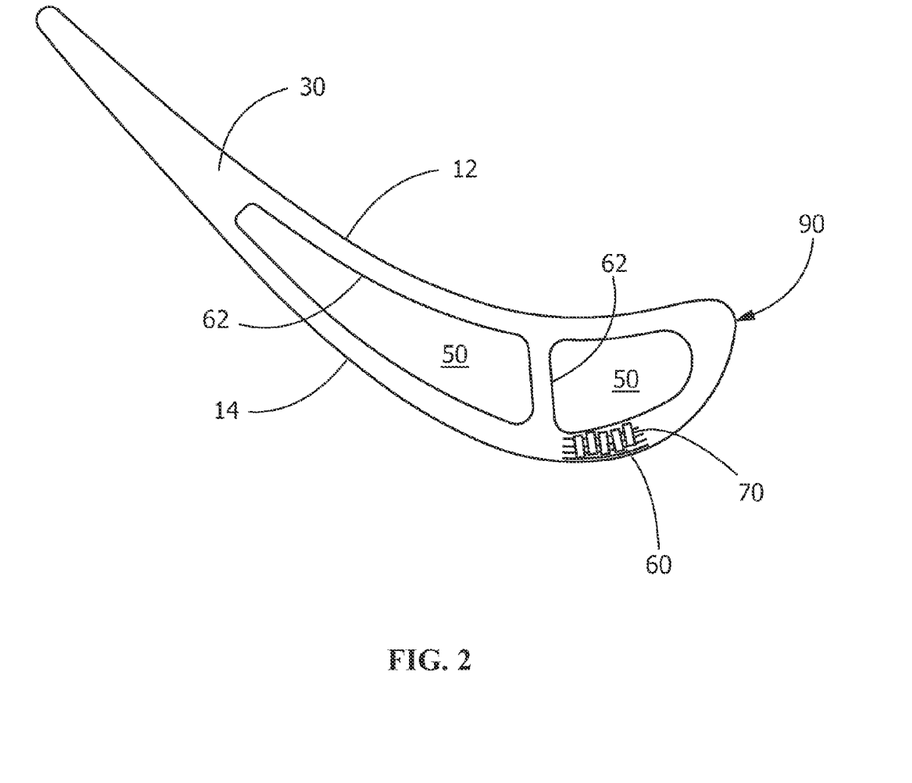
FIG. 2 is a sectional view taken in direction 2-2 of FIG. 1, according to the present disclosure.
Figure 3:
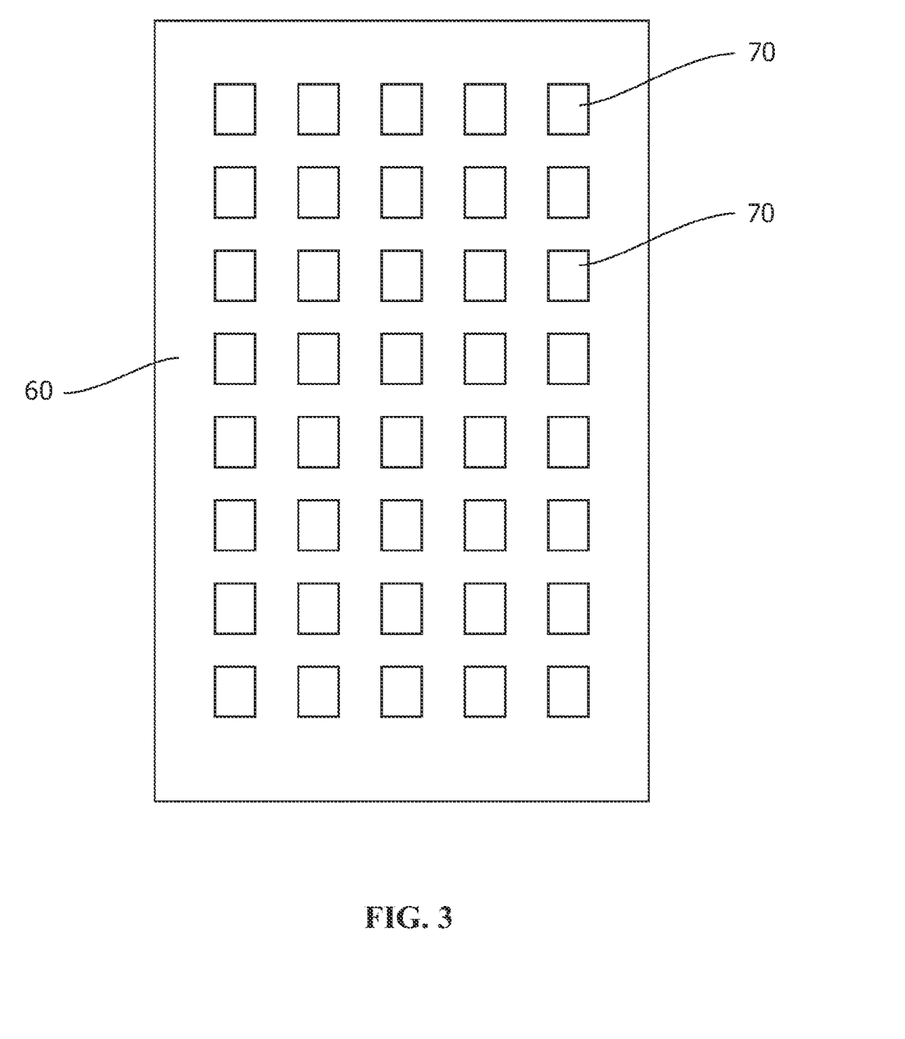
FIG. 3 is a sectional view taken in direction 3-3 of FIG. 1, according to the present disclosure.

FIG. 2 is a sectional view of component 10 taken in direction 2-2 of FIG. 1 showing internal cavities 70 of formed turbine blade 20. A plurality of plies 60 (only a few have been shown for clarity) surround and form internal cavities 70. As shown in FIG. 2, plies 60 include cavities 70 formed into and extending between plies 60. FIG. 3 is a sectional view of component 10 taken in direction 3-3 of FIG. 1 showing ceramic matrix composite ply 60 having cavities 70 formed therein. Cavities 70 extend through plies 60 and form openings sufficient to permit flow of fluid therethrough.

The arrangement of plies 60 and the cavities 70 are schematic and have been enlarged for illustration purposes. The size and geometry of the plies and voids are not limited to those shown in FIGS. 1-3. In addition, although the cavities 70 are shown to be internal to component 10, in another embodiment, cavities 70 are open to and fluidly communicate with plenum 50, other cavities 70, external to the component 10, or combinations thereof.

Figure 4:
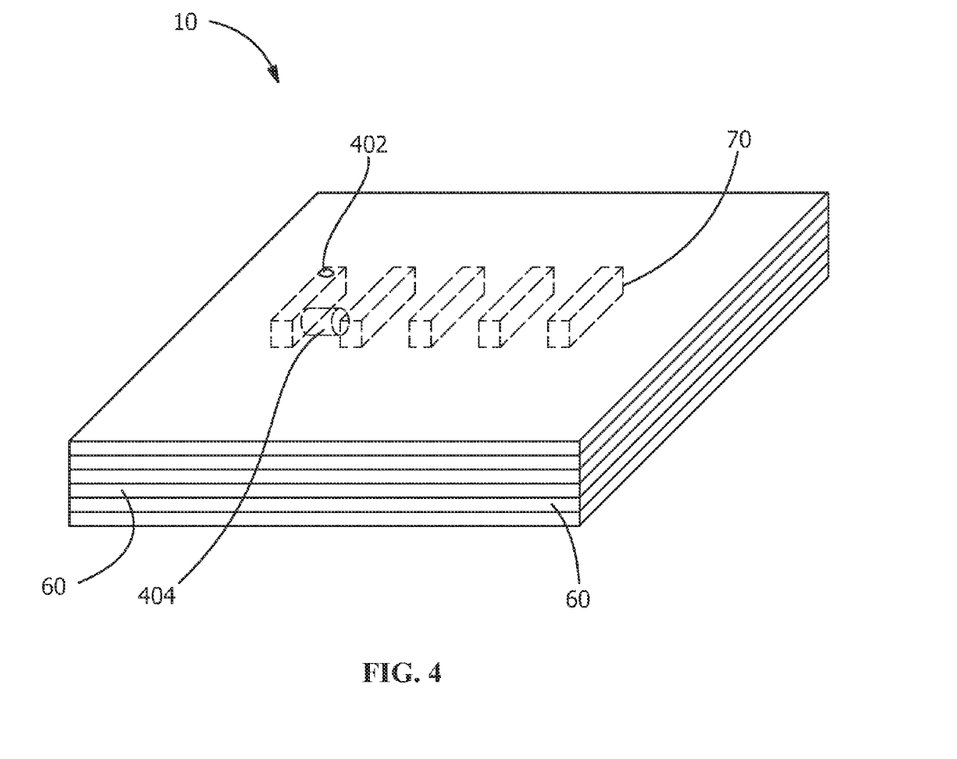
FIG. 4 shows a prospective view of a component, according to the present disclosure.

FIG. 4 shows a prospective view of a component 10, according to the present disclosure, wherein the cavities 70 are present within the component 10. As shown in FIG. 4, the component 10 may include openings 402 or passages 404 that can be machined or otherwise formed to provide fluid communication of exterior components, such as the hot gas path or the plenum 50, or with other cavities 70.

Figure 5:
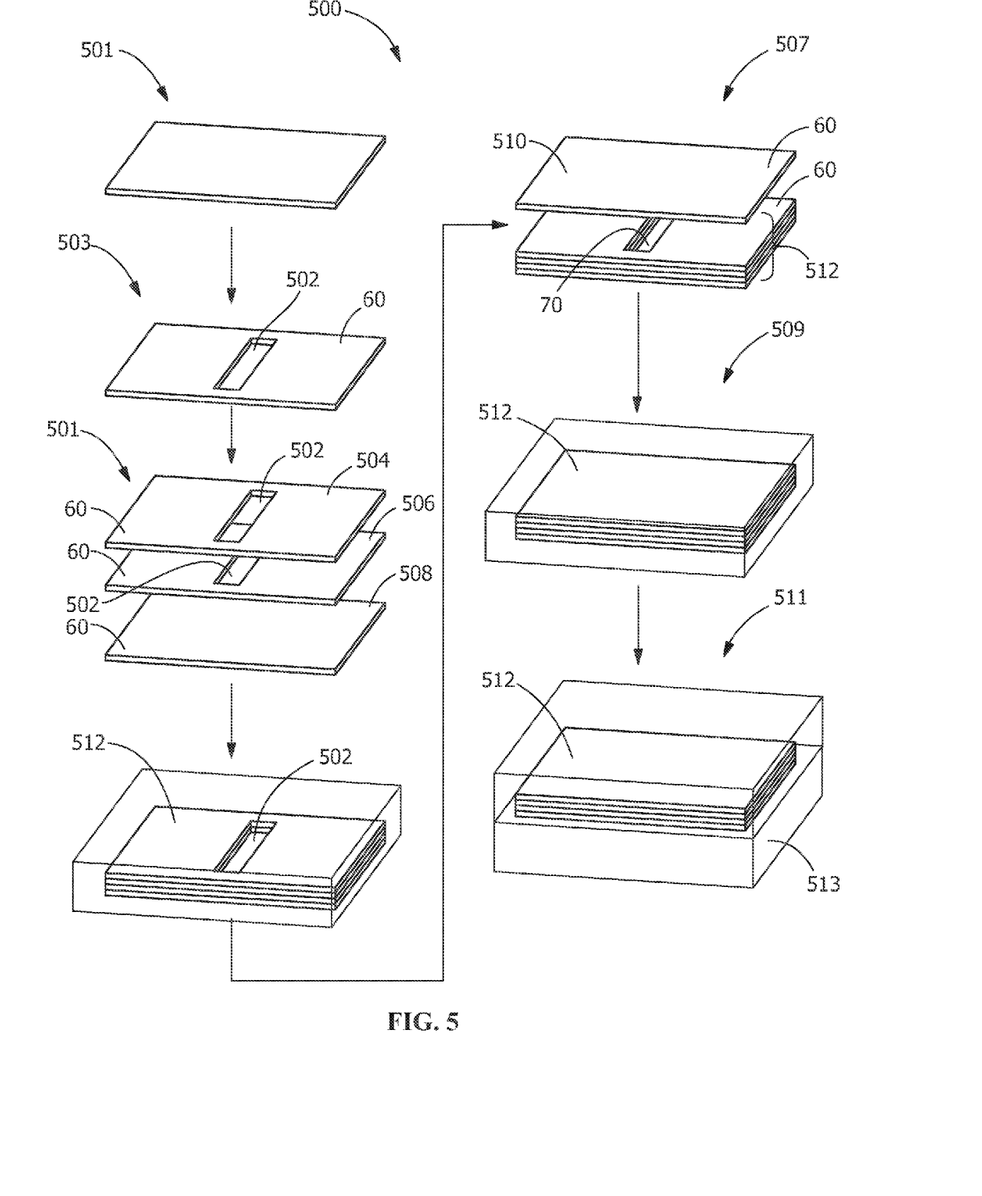
FIG. 5 schematically shows a prospective view of a process for forming a CMC component, according to an embodiment of the present disclosure.

FIG. 5 schematically shows a process of forming a CMC component 10, according to the present disclosure, having internal cavities 70 therein (see also, FIG. 4). As shown in FIG. 5, component 10 is formed using a lay-up technique. Process 500 includes providing a ceramic matrix composite ply 60 (step 501). The ceramic matrix composite ply 60 may be a single ply or a plurality of plies, such as a series of plies formed into a laminate stack. An example of material for plies 60 includes, but is not limited to, pre-preg composite plies including, for example, woven carbon fiber, binder material and coated SiC fibers. Other suitable materials for plies 60 include oxides containing alumina, zirconia, titania, magnesium, silica, mullite, and/or spinel; carbides containing silicon, boron, and/or titanium; nitrides containing silicon, and boron. Other known fibers suitable for use in the plies 60 include Nextel, Nicalon, hi-Nicalon, Tyranno, and Sylramic fibers. After providing ceramic matrix composite ply 60, a void 502 is formed in ceramic matrix composite ply 60 (step 503). The void 502 is formed using any suitable technique for forming openings in CMC materials. The geometry of the void includes any suitable geometry including a rounded, curved, elliptical, rectilinear or other suitable geometry for receiving a cooling flow. In one embodiment, the void 502 is formed in a continuous sheet, as shown in FIG. 5. In another embodiment, void 502 is formed by forming openings discontinuously in plies 60, wherein the plies 60, each having portions cut or otherwise removed along their edges, are fit together to form a void 502. In one embodiment, the void 502 is a rectilinear slot. Suitable void forming techniques include, of laser drilling, electrical discharge machining, and cutting or machining the ceramic matrix composite material of the ceramic matrix composite ply 60. After void 502 is formed in ceramic matrix composite ply 60, first ceramic matrix composite ply 504 is positioned with respect to a second ceramic matrix composite ply 506 wherein the voids in the respective plies 60 are aligned to define a cavity 70 (step 505). A third ceramic matrix composite ply 508 may further be included and may or may not include a cavity 70. The alignment is such that the voids 502 have a geometry that matches or substantially matches the adjacent ceramic matrix composite ply. The stacking of the aligned voids forms the cavity 70. The present disclosure is not limited to the number of plies 60 shown in FIG. 5. The number of plies varies based upon the desired size and configuration of the component 10 and is not particularly limited.

After the cavity 70 is formed, a cap ceramic matrix composite ply 510 may optionally be applied to close the cavities 70 (step 507). In one embodiment, the plies 60 adjacent to cavity 70 include fibers that are oriented in a direction where the fibers form a greater than 10 degree angle to the channel or hollow cavity. For example, the fibers of the cap ceramic matrix composite ply and third ceramic matrix composite ply 508 form a greater than 10 degree angle to a center axis of the cavity 70. The placement of the angled ply allows for an increase in stress concentration capability. In addition, the utilization of the angled ply assists in compaction, as aligning the fibers in this manner reduces or eliminates droop of the plies into the open void by bridging the void. Alternatively, the stack 512 of plies 60 may be allowed to have the cavity 70 exposed and may be further processed accordingly. In one embodiment, the voids 502 are aligned or formed to produce cavity 70 as a recessed area, such as a channel or groove in the stack 512. The cavity 70 includes a depth which extends into the ply stack 512 and corresponds to the cavity formed in the densified body. The cavity 70 may include a constant depth or may having a varying depth or varying cross-section, across the length of the cavity. In one embodiment, during the formation of the ply stack 512, the plies 60 are alternated in orientation (e.g., turned over in opposite directions) to assure that pre-cured laminate stack outermost plies are matrix-out for bonding to additional components or plies. In one embodiment, the external faces of the preform or partially densified laminate stack have matrix on the external surfaces that are exposed to promote bonding. After the optional step of applying the cap ceramic matrix composite ply 510, the stack 512 is placed in an autoclave and an autoclave cycle is completed (step 509). The stack 512 is subject to typical autoclave pressures and temperature cycles used in the industry for ceramic composite materials. Autoclaving pulls out any volatiles remaining in the plies and autoclave conditions can be varied depending on the ply material. After autoclaving, a burn-out process is performed to remove any remaining mandrel material or additional binders in the stack 512. The burn-out process is generally conducted at a temperature of approximately 426-648° C. (approximately 800-1200° F.).

After burn-out, the pre-form component is placed in a vacuum furnace for densification (step 511). Densification is performed using any known densification technique including, but not limited to, Silicomp, melt infiltration (MI), chemical vapor infiltration (CVI), polymer inflation pyrolysis (PIP), and oxide/oxide processes. Densification can be conducted in a vacuum furnace having an established atmosphere at temperatures above 1200° C. to allow silicon or other materials to melt-infiltrate into the preform component. As shown in FIG. 5, one suitable method of densification is melt infiltration wherein liquid matrix material 513 is drawn into stack 512 and the matrix material is solidified. The cavities 70 include a sufficient diameter and length such that the matrix material, such as silicon, does not infiltrate, or otherwise does not sufficiently infiltrate the cavity 70, such that the cavity 70 remains open after densification. After densification, densified stack 512 or densified body includes internal cavities 70, as shown in FIG. 4, and forms at least a portion of component 10.

Figure 6:
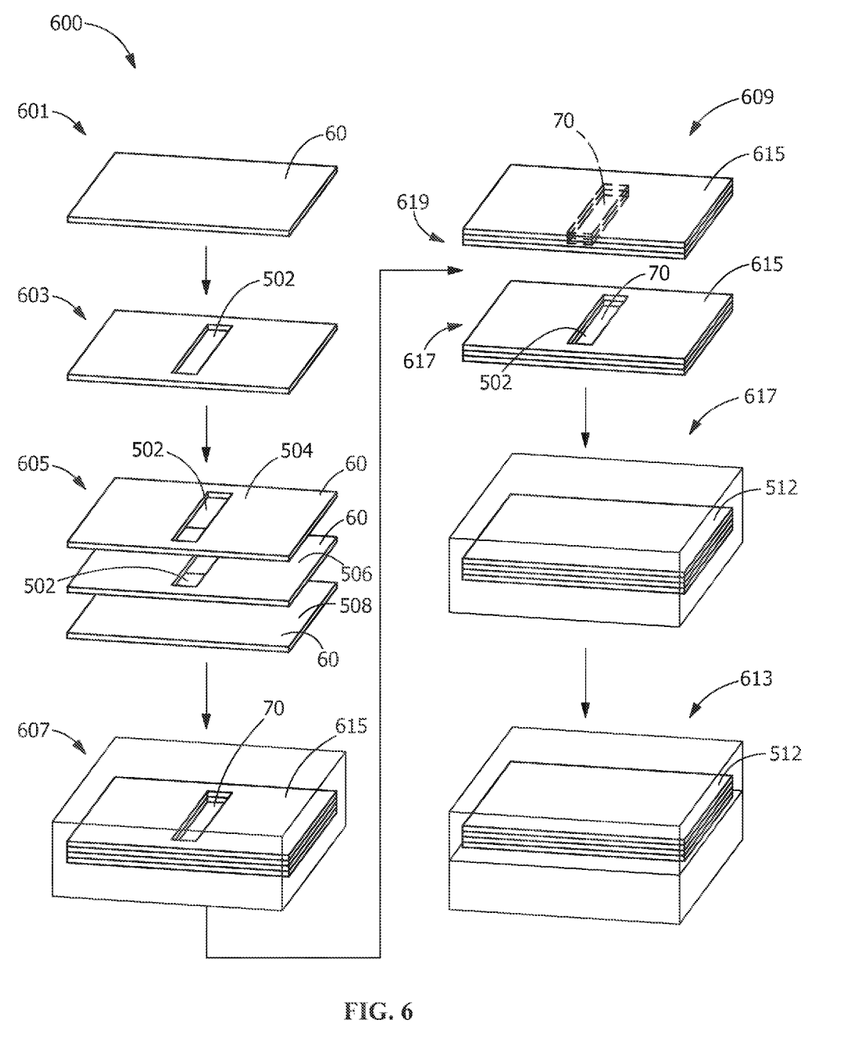
FIG. 6 schematically shows a prospective view of a process for forming a CMC component, according to an embodiment of the present disclosure.

FIG. 6 schematically shows a process of forming a CMC component 10, according to another embodiment of the present disclosure, having internal cavities 70 therein (see also, FIG. 4). As shown in FIG. 6, component 10 is formed using a lay-up technique similar to the embodiment shown in FIG. 5. Process 600 includes providing a ceramic matrix composite ply 60 (step 601). After providing ceramic matrix composite ply 60, a void 502 is formed in ceramic matrix composite ply 60 (step 603). After void 502 is formed in ceramic matrix composite ply 60, first ceramic matrix composite ply 504 is positioned with respect to a second ceramic matrix composite ply 506 wherein the voids in the respective plies 60 are aligned to define a cavity 70 (step 605). As with FIG. 5, the number of plies 60 varies based upon the desired size and configuration of the component 10 and is not particularly limited. After the plies 60 are aligned to form cavity 70, the first ceramic matrix composite ply 504 and second ceramic matrix composite ply 506 are partially rigidized to form a rigidize preform (step 607). As utilized herein, partially rigidized refers to a curing or rigidization process, such as by autoclave, wherein organics or other volatiles are removed from the first ceramic matrix composite ply 504 and second ceramic matrix composite ply 506 to at least partially rigidize the structure. The rigidization includes a sufficient cure to rigidize the structure for further processing. The temperatures and times for partial rigidization vary based upon the desired level of rigidization and the amount and type of matrix present in the plies 60.

After the rigidized preform 615 is formed, a first preform 617 a second preform 619, each having voids 502 are directed toward each other and are aligned with each other to form a larger cavity 70 within the stack 512 (step 609). In one embodiment, during the formation of the ply stack 512, the plies 60 are alternated in orientation (e.g., turned over in opposite directions) to assure that pre-cured laminate stack outermost plies are matrix-out for bonding of the preforms 615 to each other.

After the stack 512 is formed having the internal cavity 70, the stack 512 is placed in an autoclave and a curing cycle is completed (step 611). As noted above with respect to FIG. 5, the curing cycle may include an autoclave cycle and a burn-out cycle. After the burn-out cycle, the pre-form component is placed in a vacuum furnace for densification (step 613).

Figure 7:
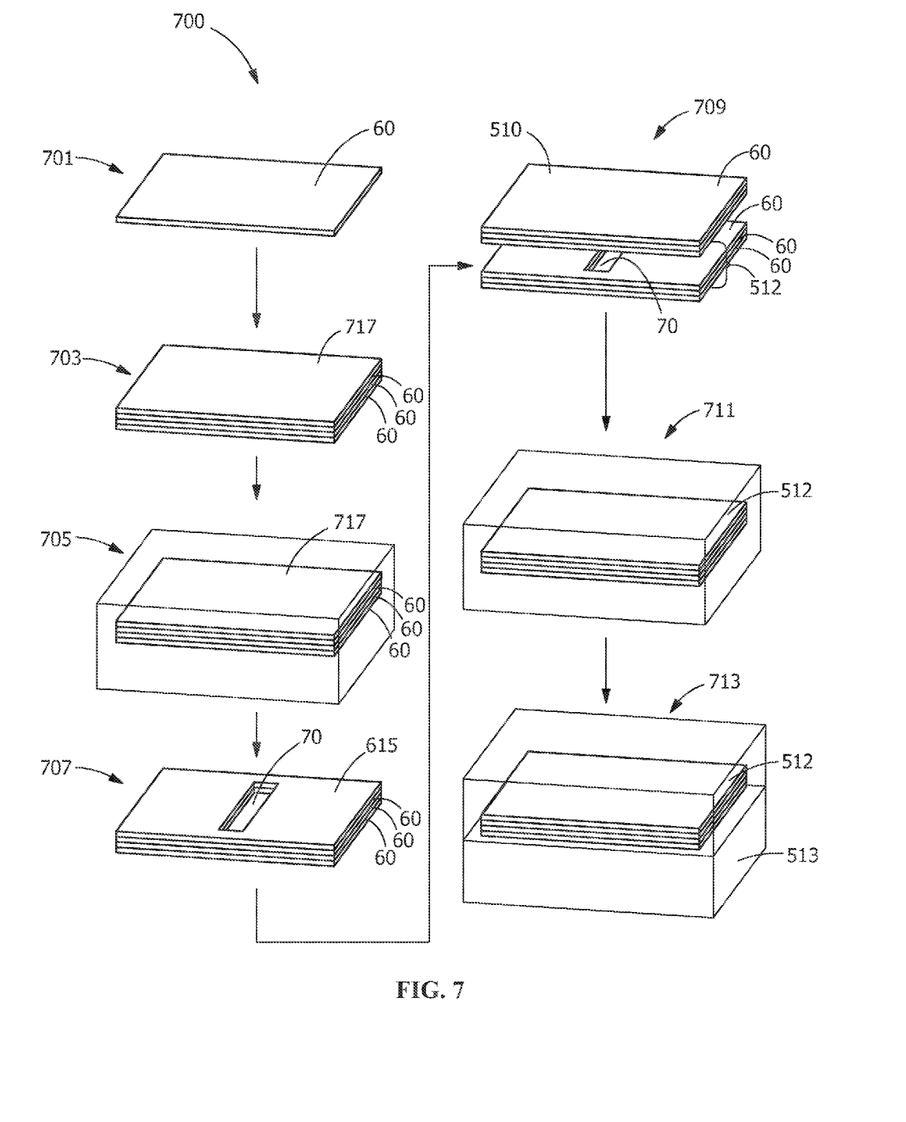
FIG. 7 schematically shows a prospective view of a process for forming a CMC component, according to an embodiment of the present disclosure.

FIG. 7 schematically shows a process of forming a CMC component 10, according to another embodiment of the present disclosure, having internal cavities 70 therein (see also, FIG. 4). As shown in FIG. 7, component 10 is formed using a lay-up technique similar to the embodiment shown in FIG. 5. Process 700 includes providing a ceramic matrix composite ply 60 (step 701). After providing ceramic matrix composite ply 60, a plurality of plies 60 are positioned in contact with one another to form a pre-cure stack 717 (step 703). As with FIG. 5, the number of plies 60 varies based upon the desired size and configuration of the component 10 and is not particularly limited. After the pre-cure stack 717 is formed, the pre-cure stack 717 is partially cured to form a rigidized preform 615 (step 705).

After the rigidized preform 615 is formed, a cavity 70 is formed in the rigidized preform (step 707). In one embodiment, the cavity 70 is as a recessed area, such as a channel or groove in the rigidized preform 615. Suitable cavity forming techniques include, of laser drilling, electrical discharge machining, and cutting or machining the ceramic matrix composite material of the rigidized preform 615. In one embodiment, during the formation of the rigidized preform 615, the plies 60 are alternated in orientation (e.g., turned over in opposite directions) to assure that pre-cured laminate stack outermost plies are matrix-out for bonding of the preforms 615 to other layers. After the formation of rigidized preform 615 having the cavity 70, a cap ceramic matrix composite ply 510 may be applied to close the cavity 70 (step 709). In another embodiment, the cap ceramic matrix composite ply 510 may be replaced with a second rigidized preform 615 having a cavity 70 formed therein. In this embodiment, the cavities 70 are aligned in the corresponding rigidized preforms and form a larger cavity 70 that is enclosed within the stack 512.

After the rigidized preform is formed having the internal cavity 70, the stack 512 is placed in an autoclave and a curing cycle is completed (step 711). As noted above with respect to FIG. 5, the curing cycle may include an autoclave cycle and a burn-out cycle. After the burn-out cycle, the pre-form component is placed in a vacuum furnace for densification (step 713).

In an alternate embodiment, a component 10 is formed as with cavities 70, according to the present disclosure, wherein the voids 502 are formed utilizing known machining operations. The component, including the cavities 70 that are open to the exterior of component 10, is incorporated into a larger CMC structure or component, wherein cavities 70 are capped with a cap ceramic matrix composite ply that is biased in the direction opposing the cavity 70 direction.

In an alternate embodiment, a component 10 is formed as with cavities 70, according to the present disclosure. However, a cap ceramic matrix composite ply 510 is not applied. The stack 512 is subject to an autoclave cycle. After the autoclave cycle, the cavities 70 are machined by any suitable machining process such that misalignment of the plies in the cavity are removed. After the machining step, the stack 512 with the machined cavity 70 are subjected to another autoclave cycle and are densified.

In one embodiment, cavities 70 are sufficiently large and open in component 10 such that coolant or other fluid can be directed therethrough to provide cooling to component 10. The cavities, as manufactured, according, for example, to the process shown in FIG. 5, are closed and internal to the component 10. The cavities 70 for cooling may be fed and/or exhausted to and/or from the plenum 50, other cavities 70 or external to the component, by machining or otherwise forming openings, such as feed holes and hot-gas path dump holes, into the component 10.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A process of producing a ceramic matrix composite component, the process comprising:
    forming a void in a first ceramic matrix composite ply;
    forming a void in a second ceramic matrix composite ply, the void in the second ceramic matrix composite ply including a geometry that matches the void in the first ceramic matrix composite ply;
    positioning the second ceramic matrix composite ply on the first ceramic matrix composite ply, the positioning coextensively aligning the voids to at least partially define a cavity in the component;
    positioning a third ceramic matrix composite ply on the first ceramic matrix composite ply; and
    densifying the first ceramic matrix composite ply, the second ceramic matrix composite ply and the third ceramic matrix composite ply to form a densified body, wherein the cavity is present in the densified body, and wherein the cavity is entirely enclosed within the densified body during the densifying.

2. The process of claim 1, wherein the forming of the voids is by one or more of laser drilling, electrical discharge machining, cutting or machining the ceramic matrix composite material of the first ceramic matrix composite ply or the second ceramic matrix composite ply.

3. A process of producing a ceramic matrix composite component, the process comprising:
    positioning a first ceramic matrix composite ply in contact with a second ceramic matrix composite ply;
    partially rigidizing the first ceramic matrix composite ply and the second ceramic matrix composite ply to form a rigidized preform;
    forming a void in the first ceramic matrix composite ply of the rigidized preform and a void in the second ceramic matrix composite ply of the rigidized preform to at least partially define a cavity in the component, the void in the second ceramic matrix composite ply including a geometry that matches the void in the first ceramic matrix composite ply, and being coextensively aligned therewith;
    positioning a third ceramic matrix composite ply on the first ceramic matrix composite ply;
    subjecting the first ceramic matrix composite ply, the second ceramic matrix composite ply and the third ceramic matrix composite ply to rigidizing; and
    densifying the first ceramic matrix composite ply, the second ceramic matrix composite ply and the third ceramic matrix composite ply to form a densified body, the densifying including melt infiltration or chemical vapor deposition,
    wherein the cavity is present in the densified body, and wherein the cavity is entirely enclosed within the densified body during the densifying.

4. The process of claim 3, wherein the third ceramic matrix composite ply includes fibers at a greater than 10 degree angle to a center axis of the cavity.

5. The process of claim 1, further comprising machining at least one opening into the densified body.

6. The process of claim 1, wherein the densifying includes melt infiltration or chemical vapor deposition.

7. The process of claim 1, further comprising rigidizing the first ceramic matrix composite ply, the second ceramic matrix composite ply and the third ceramic matrix composite ply prior to densifying.

8. The process of claim 3, wherein the densified body forms at least a portion of the ceramic matrix composite component, the ceramic matrix composite component being selected from the group consisting of a liner, a blade, a shroud, a nozzle, a combustor, a nozzle end wall and a blade platform.

9. The process of claim 3, wherein one or more of the first ceramic matrix composite ply, the second ceramic matrix composite ply and the third ceramic matrix composite ply are pre-preg composite plies.

10. The process of claim 3, wherein forming the voids is by one or more of laser drilling, electrical discharge machining, cutting or machining the ceramic matrix composite material of the first ceramic matrix composite ply or the second ceramic matrix composite ply.

11. The process of claim 3, wherein the voids are a recessed area in the rigidized preform having varying depth or varying cross-sectional diameter.

12. The process of claim 3, wherein the third ceramic matrix composite ply is a second rigidized preform having an additional void.

13. The process of claim 3, wherein the ceramic matrix composite component is a hot gas path turbine component.

14. The process of claim 3, wherein the cavity has a rectilinear boundary along at least a portion of the densified body.

15. The process of claim 14, wherein the rectilinear boundary is a machined boundary.

16. The process of claim 14, wherein the rectilinear boundary is a cut boundary.

17. The process of claim 14, wherein the cavity includes varying depth or varying cross-sectional diameter.

18. The process of claim 3, further including, following the densifying, forming openings in the component to the cavity to accept and exhaust a cooling feed, wherein the cavity defines a cooling passage.

19. The process of claim 1, further including, following the densifying, forming openings in the component to the cavity to accept and exhaust a cooling feed, wherein the cavity defines a cooling passage.

* * * * *